United States Patent
Sauer et al.

(10) Patent No.: US 12,209,303 B2
(45) Date of Patent: Jan. 28, 2025

(54) APPARATUS FOR PROVIDING A LIQUEFIED MATERIAL, DOSAGE SYSTEM AND METHOD FOR DOSING A LIQUEFIED MATERIAL

(71) Applicant: Applied Materials, Inc., Santa Clara, CA (US)

(72) Inventors: Andreas Sauer, Großostheim (DE); Volker Hacker, Altenstadt-Oberau (DE); Thomas Deppisch, Aschaffenburg (DE); Ralf Scheidt, Wemmetsweiler (DE)

(73) Assignee: Applied Materials, Inc., Santa Clara, CA (US)

( * ) Notice: Subject to any disclaimer, the term of this patent is extended or adjusted under 35 U.S.C. 154(b) by 345 days.

(21) Appl. No.: 17/563,242

(22) Filed: Dec. 28, 2021

(65) Prior Publication Data
US 2022/0228251 A1 Jul. 21, 2022

Related U.S. Application Data

(60) Provisional application No. 63/138,154, filed on Jan. 15, 2021.

(51) Int. Cl.
*C23C 14/24* (2006.01)
*G01F 11/28* (2006.01)
(Continued)

(52) U.S. Cl.
CPC ........... *C23C 14/246* (2013.01); *G01F 11/28* (2013.01); *H01M 4/0423* (2013.01);
(Continued)

(58) Field of Classification Search
CPC ....... C23C 14/246; C23C 14/24; C23C 14/14; C23C 14/228; C23C 14/26; C23C 14/543;
(Continued)

(56) References Cited

U.S. PATENT DOCUMENTS

2003/0194861 A1* 10/2003 Mardian ........... C23C 16/45557
438/778
2004/0007186 A1* 1/2004 Saito .................. G05D 16/2013
118/724
(Continued)

FOREIGN PATENT DOCUMENTS

CN     110117770 A   *   8/2019  ............. C23C 14/12
CN     110846622 A      2/2020
(Continued)

OTHER PUBLICATIONS

International Search Report and Written Opinion, PCT/US2021/065289, Apr. 20, 2022.
Taiwan Office Action dated Sep. 7, 2022 for Application No. 111101387.

*Primary Examiner* — Bob Zadeh
(74) *Attorney, Agent, or Firm* — Patterson + Sheridan, LLP

(57) ABSTRACT

A vapor deposition apparatus is provided. The vapor deposition apparatus includes a tank for providing a liquefied material, a first unit having an alterable first volume, the first unit including a first actuator and including a first line to be in fluid communication with the tank. Further, the vapor deposition apparatus includes a second unit having an alterable second volume, the second unit including a second actuator and including a second line to be in fluid communication with the tank. The vapor deposition apparatus includes an evaporation arrangement, the evaporation arrangement being in fluid communication with the first unit and the second unit. The first actuator and the second actuator are configured to alternatingly provide a force to the alterable first volume and the alterable second volume for providing the liquefied material to the evaporation arrangement.

20 Claims, 4 Drawing Sheets

(51) Int. Cl.
 *H01M 4/04* (2006.01)
 *H01M 4/38* (2006.01)
 *H01M 10/052* (2010.01)
 *H01M 4/02* (2006.01)

(52) U.S. Cl.
 CPC ......... *H01M 4/382* (2013.01); *H01M 10/052* (2013.01); *H01M 2004/027* (2013.01)

(58) Field of Classification Search
 CPC ...... G01F 11/28; G01F 11/021; G01F 11/029; H01M 4/0423; H01M 4/382; H01M 10/052; H01M 2004/027; H01M 4/1395; H01M 4/0402; Y02E 60/10
 See application file for complete search history.

(56) References Cited

U.S. PATENT DOCUMENTS

| | | | | |
|---|---|---|---|---|
| 2010/0236480 | A1* | 9/2010 | Hara | C23C 16/4481 137/551 |
| 2013/0312674 | A1* | 11/2013 | Liu | F01K 17/04 137/12 |
| 2015/0299853 | A1* | 10/2015 | Keller | H01M 4/381 118/726 |

FOREIGN PATENT DOCUMENTS

| | | | | |
|---|---|---|---|---|
| EP | 2746423 | A1 * | 6/2014 | ........... C23C 14/082 |
| GB | 2348888 | A * | 10/2000 | ............. C23C 16/18 |
| KR | 10-2020-0010059 | A | 1/2020 | |
| TW | 202024367 | A | 7/2020 | |

* cited by examiner

APPARATUS FOR PROVIDING A LIQUEFIED MATERIAL, DOSAGE SYSTEM AND METHOD FOR DOSING A LIQUEFIED MATERIAL

FIELD OF INVENTION

Embodiments of the present disclosure relate to deposition and evaporation of alkali metals or alkaline earth metals, such as lithium. Embodiments of the present disclosure particularly relate to deposition apparatuses, and methods for dosing the provided material. Specifically, they relate to a vapor deposition apparatus, a dosage system for providing a liquefied material to an evaporation arrangement and a method for dosing a liquefied material.

BACKGROUND

Various techniques for deposition on a substrate, for example, chemical vapor deposition (CVD) and physical vapor deposition (PVD) are known. For deposition at high deposition rates, thermal evaporation may be used as a PVD process. For thermal evaporation, a source material is heated up to produce a vapor that may be deposited, for example, on a substrate. Increasing the temperature of the heated source material increases the vapor concentration and can facilitate high deposition rates. The temperature for achieving high deposition rates depends on the source material physical properties, e.g. vapor pressure as a function of temperature, and substrate physical limits, e.g. melting point.

For example, the source material to be deposited on the substrate can be heated in a tank to produce vapor at an elevated vapor pressure. The vapor can be transported from the tank to a coating volume in a heated manifold. The source material vapor can be distributed from the heated manifold onto a substrate in a coating volume, for example, a vacuum chamber.

Modern thin film lithium batteries may include a lithium layer. The lithium layer is formed, for example, through the deposition of lithium in a vapor state on the substrate. Since lithium is highly reactive, a plurality of measures needs to be addressed to operate and maintain such deposition systems.

For alkali and/or alkaline earth metals, some arrangements are not so amenable to high volume and low-cost manufacturing, because the methods have serious challenges in managing the high reactivity of the materials, while scaling to high volume production. This presents challenges in producing uniformly deposited pure lithium. Highly reactive materials, especially lithium, can easily be oxidized in reaction with ambient surroundings, e.g., gases, materials, etc. Lithium is of particular interest since lithium is suitable for the production of higher energy density batteries and accumulators, i.e. primary batteries and secondary batteries.

Common deposition systems for lithium, and other alkali metals or alkaline earth metals, respectively, may utilize sputter sources or conventional evaporation sources and methods of operating thereof. Sputtering methods for lithium are challenging, in particular with respect to costs and manufacturability, in light of the reactivity of lithium. The high reactivity at first influences the manufacturing of the target, which is a necessary component for sputtering, and secondly influences the handling of the resulting targets. Since the melting point of lithium is relatively low, at 183° C., the deposition rate can also be limited as the melting point limits against a high-power density sputtering regime, a more amenable regime for high volume and lower cost manufacturing. In other words, the low melting point of lithium limits the maximum power which can be applied and therefore, the maximum deposition rate which can be achieved.

In view of the above, it is advantageous to have new deposition apparatuses, in particular vapor deposition apparatuses and methods for controlling the provision of evaporated material.

SUMMARY

In light of the above, a vapor deposition apparatus, a dosage system for providing a liquefied material to an evaporation arrangement and a method for dosing a liquefied material according to the independent claims are provided. Further aspects, advantages and features of the present disclosure are apparent from the description and the accompanying drawings.

According to one embodiment, a vapor deposition apparatus is provided. The vapor deposition apparatus includes a tank for providing a liquefied material, a first unit having an alterable first volume, the first unit including a first actuator and including a first line to be in fluid communication with the tank. The vapor deposition apparatus further includes a second unit having an alterable second volume, the second unit including a second actuator and including a second line to be in fluid communication with the tank. The vapor deposition apparatus further includes an evaporation arrangement, the evaporation arrangement being in fluid communication with the first unit and the second unit. The first actuator and the second actuator are configured to alternatingly provide a force to the alterable first volume and the alterable second volume for providing the liquefied material to the evaporation arrangement.

According to one embodiment, a dosage system for providing a liquefied material to an evaporation arrangement is provided. The dosage system includes a first unit having an alterable first volume and including a first actuator and a second unit having an alterable second volume and including a second actuator. The first actuator and the second actuator are configured to alternatingly provide a force to the first unit and the second unit for alternatingly altering the first volume and the second volume for providing the liquefied material to the evaporation arrangement.

According to one embodiment, a method for dosing a liquefied material is provided. The method includes liquifying a material in a tank, providing the liquefied material from the tank to a first unit having an alterable first volume and to a second unit having an alterable second volume, acting on the alterable first volume with a first actuator providing a first force to transport the liquefied material from the first unit towards an evaporation arrangement, acting on the alterable second volume with a second actuator providing a third force to transport the liquefied material from the second unit towards the evaporation arrangement and acting on the alterable first volume with the first actuator providing a second force lower than the first force, and acting on the alterable second volume with the second actuator providing a fourth force lower than the third force.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
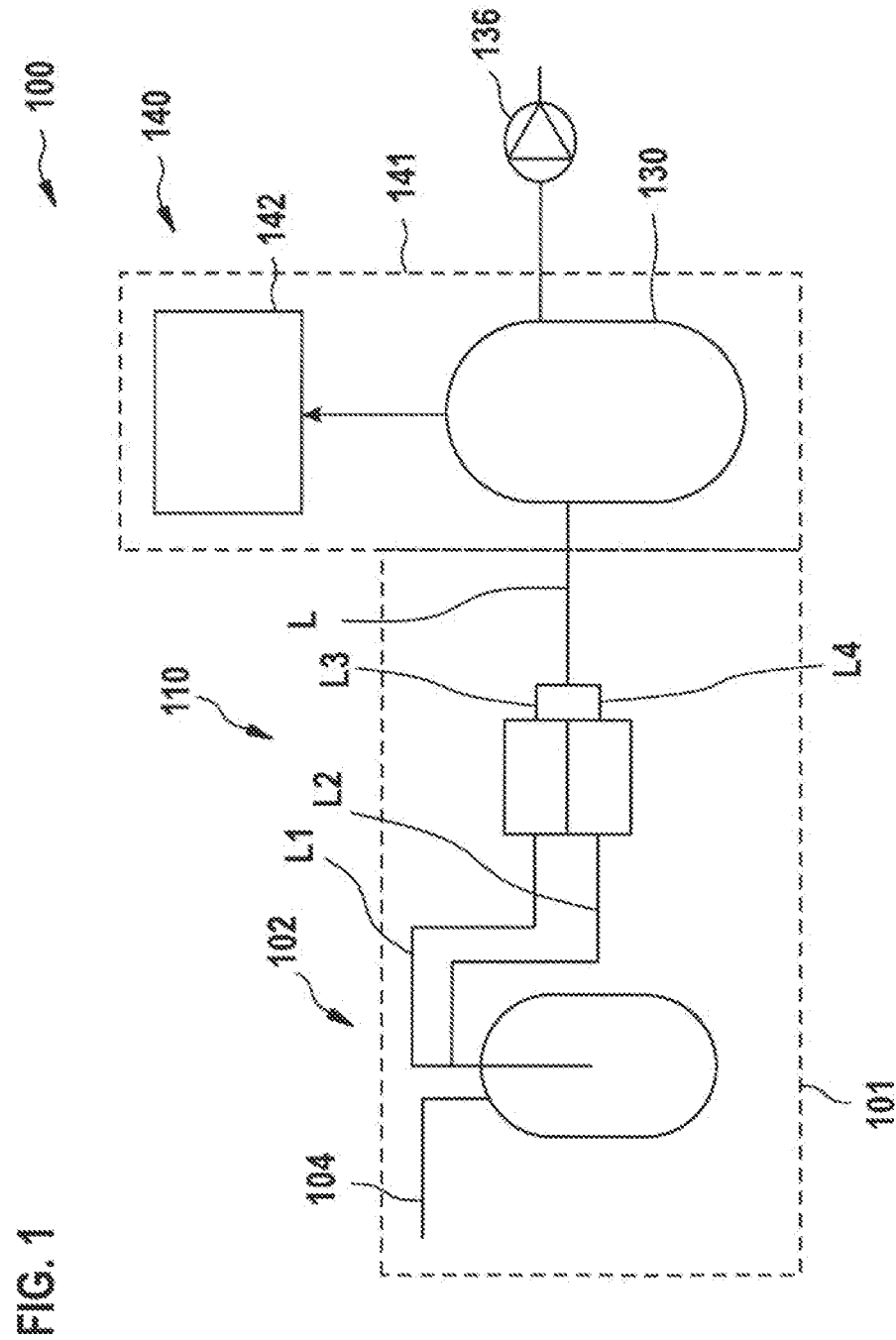
FIG. 1 shows a vapor deposition apparatus according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Within the following description of the drawings, the same reference numbers refer to the same or similar components. Generally, only the differences with respect to the individual embodiments are described. Unless specified otherwise, the description of a part or aspect in one applies to a corresponding part or aspect in another embodiment as well.

In the following, one or more evaporation concepts will be described for lithium as a material to be evaporated. According to some embodiments, which can be combined with other embodiments described herein, the evaporation concepts may also be applicable to other materials. Particularly, the evaporation concepts may also be applicable for highly reactive materials, for example, alkali metals or alkaline earth metals. Further, the evaporation concepts may be beneficially used for very high deposition rates resulting in layer thicknesses of a few microns or above on a roll-to-roll coater.

For the evaporation of alkali metals or alkaline earth metals, e.g. lithium, beneficially the material to be evaporated and deposited onto a substrate is liquefied prior to evaporation. Guiding of the liquefied material towards the evaporation arrangement may include use of a pressurized inert gas for exerting a force to the liquefied material for pressing the material through a conduit to the evaporator. Typically, a valve including a flowmeter is used for controlling the flow rate of the liquefied material and thus, the resulting evaporation rate. However, the provision of the material to be evaporated being regulated by a gas pressure may be inaccurate and may lead to interruptions of the material provision and thus, to inefficient evaporation processes.

In light of the above, an improved material provision is beneficial as regards evaporation efficiency, system maintenance and yield of processed substrates.

According to some embodiments, methods of evaporation or apparatuses for evaporation of a material are provided, particularly of an alkali metal or alkaline earth metal. A tank configured to provide the material is provided. The tank may be provided in a first compartment. A heating arrangement configured to heat the material to provide a liquefied material is provided. Further, the tank may be configured to heat the material to obtain the liquefied material. The tank may include a heating assembly for heating the material.

The tank may include a gas inlet configured for an inlet of a gas in the tank, wherein particularly a pressure control of the gas can be provided. For example, the gas can be an inert gas such as argon. An evaporation zone configured to flash evaporate the liquefied material may be provided in a second compartment. A line or conduit providing a fluid communication between the tank and the evaporation zone may be provided. The flow rate of the liquid material in the line or conduit defines the deposition rate. The flow rate can be adjusted according to embodiments of the present disclosure. According to some embodiments, which can be combined with other embodiments described herein, the evaporation zone can be provided in a crucible. The crucible can be included in an evaporation arrangement, particularly an evaporation arrangement having a plurality of nozzles, such as a one-dimensional array of nozzles or two-dimensional array of nozzles.

FIG. 1 shows a vapor deposition apparatus 100. The vapor deposition apparatus may include a first compartment indicated by dashed line 101. The first compartment may be configured to maintain temperatures at or above the melting temperature of the material to be evaporated. For example, for lithium, a first temperature of the first compartment can be 190° or above, for example, 220° or above, as a further example 250° C. or above. Atmospheric conditions may be provided in the first compartment. According to some embodiments, which can be combined with other embodiments described herein, the atmospheric conditions can be provided with a relative humidity of 2% or below, such as 1% or below, or even 0.5% or below. Accordingly, the first compartment may include a dehumidifier, particularly a dehumidifier configured to provide the relative humidity described above. Reducing the humidity in the first compartment may be particularly useful for evaporating highly reactive materials, for example, alkali metals or alkaline earth metals, such as lithium.

According to embodiments that can be combined with any other embodiment described herein, a tank 102 is provided for providing the material to be evaporated. A gas inlet 104 may be arranged at the tank. The gas inlet 104 may provide a gas conduit in fluid communication with the tank 102. A gas, for example, an inert gas such as argon, can be disposed in the tank 102. A pressure control can be provided for the gas inlet 104 to generate overpressure in the tank. In the tank, the material to be evaporated may be liquefied. The liquid material to be deposited in an evaporation arrangement may be guided through a plurality of lines through the apparatus. The overpressure in the tank 102 may move the liquid material through the plurality of lines. In particular, the overpressure in the tank may provide the liquid material to a dosage system 110. According to some embodiments, which can be combined with other embodiments described herein, the pressure in the tank 102 can be controlled to be constant during evaporation. The pressure in the tank 102 may not be utilized to adjust the deposition rate.

According to embodiments that can be combined with any other embodiment described herein, the vapor deposition apparatus includes a heating arrangement for providing heat to the material to obtain a liquefied or liquid material. The heating arrangement may be configured to provide heat e.g. a temperature at or above the melting temperature of the material, in the first compartment 101. Additionally or alternatively, the heating arrangement may be provided at the tank 102 for providing heat, e.g. a temperature at or above the melting temperature of the material, to the material in the tank.

According to embodiments that can be combined with any other embodiment described herein, the vapor deposition apparatus may include a dosage system 110. The dosage system 110 may include a first unit and a second unit. The first unit and the second unit may be configured to provide a predetermined volume of liquid material to an evaporation arrangement. In particular, the first unit and the second unit may be configured to alternatingly provide the liquid material to the evaporation arrangement.

According to embodiments that can be combined with any other embodiment described herein, the vapor deposition apparatus includes a first unit having an alterable first volume and including a first actuator. The first unit includes a first line L1 to be in fluid communication with the tank. The vapor deposition apparatus further includes a second unit having an alterable second volume and a second actuator. The second unit includes a second line L2 to be in fluid communication with the tank. The first line L1 and the second line L2 may be lines of the plurality of lines guiding the liquefied material through the apparatus. The first unit and the second unit may include a conduit L for being in fluid communication with an evaporation arrangement. The plurality of lines may include the conduit L. The first unit and the second unit may be included by the dosage system 110. The first actuator and the second actuator are configured to alternatingly provide a force to the alterable first volume and the alterable second volume for providing the liquefied material to the evaporation arrangement. In other words, the alterable first volume and the alterable second volume may be alternatingly altered for providing the liquid material towards the evaporation arrangement.

According to some embodiments, which can be combined with other embodiments described herein, the first compartment 101 can be provided with a thermal insulation at the interface to the first compartment or at least partially around the first compartment. Accordingly, the temperature within the first compartment can be above the melting temperature of the material to be evaporated, particularly constantly above the melting temperature. The one or more components within the compartment, particularly the components in contact with the material to be evaporated, can also be provided above the melting temperature. Blocking of the material, e.g. lithium can be avoided. For example, the plurality of lines such as the first line L1 and/or the second line L2 can be provided with a material being a bad heat conductor, e.g. stainless steel. For example, the conduit L can have an insulator at the interface to the first compartment 101.

According to embodiments that can be combined with any other embodiment described herein, the first unit and the second unit may be in fluid communication with an evaporation arrangement 140 e.g. via the conduit L. The evaporation arrangement may be provided in a second compartment 141. The evaporation arrangement may include a crucible 130 and an enclosure 142 in fluid communication with the crucible. The enclosure, i.e. a distribution enclosure, can be a vapor distribution pipe or a vapor distribution showerhead. The vapor can exit the enclosure 142 through a plurality of nozzles provided in or at a wall of the enclosure. Particularly, a pressure within the enclosure is at least one magnitude higher as compared to the pressure in the second compartment, for example, a vacuum chamber, in which the evaporation arrangement may at least partially be disposed. The second compartment 141 may be a processing chamber.

According to embodiments that can be combined with any other embodiment described herein, the second chamber may include a pump 136. The pump 136 may be a vacuum pump utilized for at least partially evacuating the vacuum chamber for a process region. According to embodiments, the vapor deposition apparatus may include a controller. The controller may be configured to control the first actuator, the second actuator, the first operable flow restriction device, the second operable flow restriction device, the third operable flow restriction device and the fourth operable flow restriction device as well as the pressure control of the gas at the gas inlet of the tank. Further, the controller may be configured to control the refilling of the tank.

Figure 2:
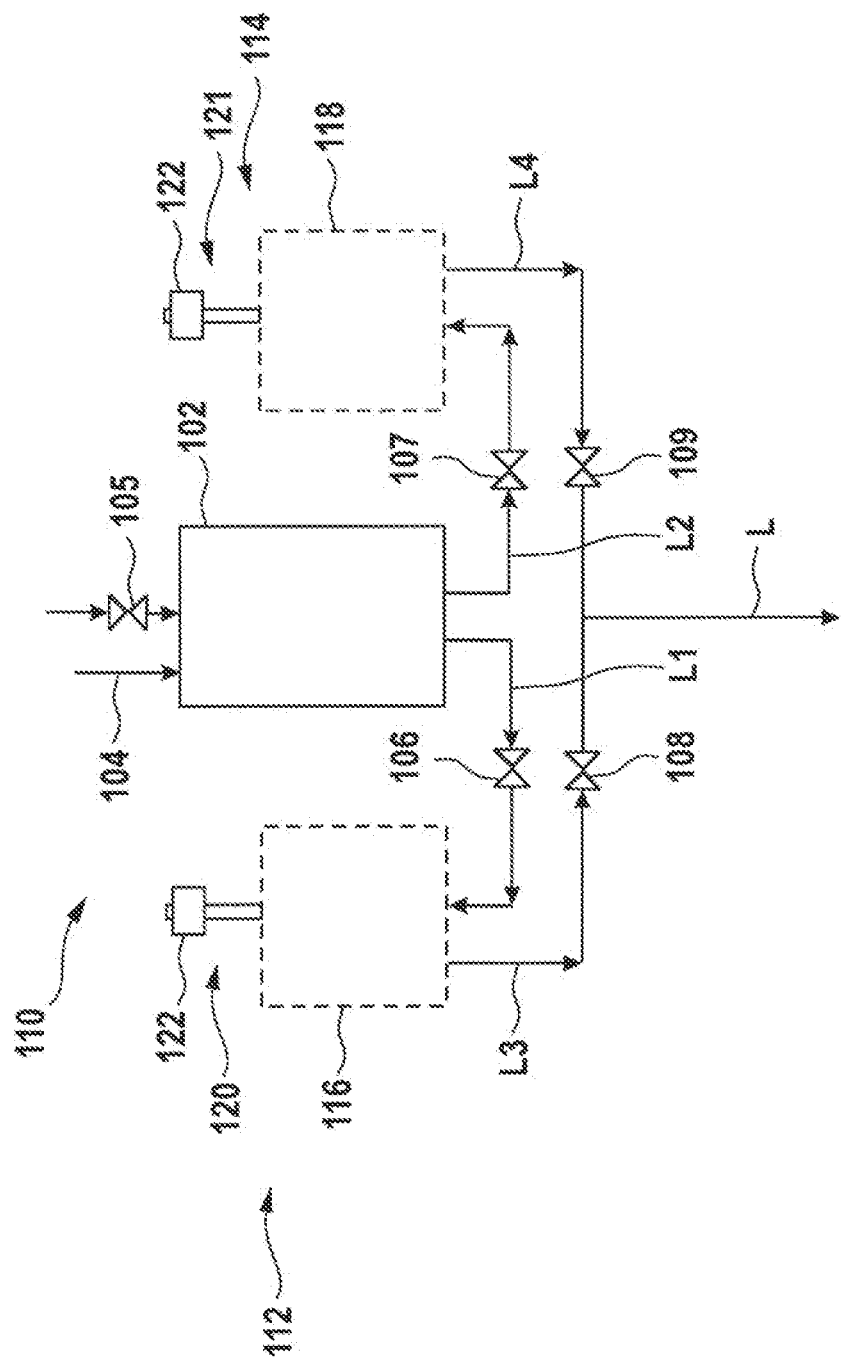
FIG. 2 shows a vapor deposition apparatus according to embodiments described herein.

According to embodiments that can be combined with any other embodiment described herein and as exemplarily shown in FIG. 2, the vapor deposition apparatus may include a dosage system 110. The dosage system 110 may include the first unit 112 and the second unit 114. The dosage system 110 may further include the tank 102. The first unit 112 includes the alterable first volume 116 and the second unit includes the alterable second volume 118. The first volume and the second volume may be provided with liquefied material from the tank 102. The material may be provided to the first unit, i.e. to the first volume and to the second unit, i.e. to the second volume via the first line L1 and the second line L2, respectively. The first unit and the second unit, in particular the alterable first volume, the alterable second volume as well as the first line and the second line as well as a third line and a fourth line and conduit L may be made of a material that is resistant to corrosion e.g. stainless steel, stainless steel alloys, and/or molybdenum.

According to embodiments that can be combined with any other embodiment described herein, the tank 102 may include a filling inlet for providing the material to the tank. The filling inlet may include a flow restriction device 105, e.g. a valve, to regulate a filling volume of the tank. In particular, the filling inlet may be configured to provide a raw material to be melted, i.e. to be liquefied in the tank 102. Accordingly, the liquefied material may be continuously provided inside the tank and from the tank towards the dosage system and the evaporation arrangement.

According to embodiments that can be combined with any other embodiment described herein, the first line may include a first operable flow restriction device 106 for regulating a first flow of the liquefied material towards the first unit. The second line may include a second operable flow restriction device 107 for regulating a second flow of the liquefied material towards the second unit. The liquefied material in the tank may be provided to the first unit and the second unit by providing a force to the liquefied material, i.e. by disposing an inert gas into the tank for pushing the liquefied material into the first line L1 and the second line L2. By controlling the first operable flow restriction device 106 and the second operable flow restriction device 107, the liquefied material may be disposed into the first unit and the second unit, respectively.

According to embodiments that can be combined with any other embodiment described herein, the first unit may include a third line L3 providing a fluid communication of the first unit with the evaporation arrangement, e.g. via conduit L. The third line L3 may be connected to the conduit L. the third line L3 may include a third operable flow restriction device 108 to control a flow of material towards the evaporation arrangement from the first unit 112, i.e. from the alterable first volume 116. The second unit may include a fourth line L4 providing a fluid communication of the second unit with the evaporation arrangement, e.g. via conduit L. The fourth line L4 may be connected to the conduit L. The fourth line L4 may include a fourth operable flow restriction device 109 to control a flow of material towards the evaporation arrangement from the second unit 114, i.e. from the alterable second volume 118. The dosage system and the evaporation arrangement are exemplarily depicted in FIG. 3.

According to embodiments that can be combined with any other embodiment described herein, to provide the liquefied material towards the evaporation arrangement, the first volume 116 and the second volume 118 may be altered. In particular, the first volume and the second volume may be compressed to provide material towards the evaporation arrangement. Additionally or alternatively, e.g. to stop provision of material towards the evaporation arrangement, the first volume and the second volume may be expanded, respectively. Compressing the volume may be understood as compressing the volume of a device or compressing a volume of the material provided inside the first unit and/or the second unit.

According to embodiments that can be combined with any other embodiment described herein, the first unit 112 and the second unit 114 include a first actuator 120 and a second actuator 121, respectively. The first actuator and the second actuator may provide a defined movement such that a defined volume of the liquefied material may be provided to the evaporation arrangement. Each of the first actuator and the second actuator may include a motor 122. The motor 122 may be connected to the first unit and/or the second unit, respectively. The first actuator and the second actuator may be a linear motor, particularly a motor driven spindle gear, a crank shaft and/or a rack-and-pinion drive. For example, each turn of the motor driven spindle gear may correspond to a predetermined volume of liquefied material provided to the evaporation arrangement when the motor driven spindle gear is operated. The first actuator and the second actuator may be configured to alternatingly provide a force to the alterable first volume and the alterable second volume for alternatingly altering the first volume and the second volume for providing the liquefied material to the evaporation arrangement. A material flow from the first unit and/or the second unit towards the evaporation arrangement may be adjusted via the force provided by the first actuator and/or the second actuator, respectively. The higher the force, the more material may be provided towards the evaporation arrangement.

Advantageously, by controlling the actuator, i.e. by controlling the force provided by the actuator to the respective unit, the material flow may be adjusted more accurately. Thus, dosing of the material to be provided to the evaporation arrangement, i.e. the adjustment of the amount of material provided to the evaporation arrangement, may be facilitated and improved. Further advantageously, the provision of material towards the evaporation arrangement may be stopped instantaneously by providing a reverse force to the actuators, respectively.

For example, the liquefied material may be provided from the tank 102 to the first unit, i.e. the first operable flow restriction device 106 may be opened and the liquefied material may be provided from the tank to the first unit and may be disposed in the first volume. The first actuator may then provide a force to the first unit, i.e. to the first volume such that the first volume is altered, e.g. reduced or compressed. Thus, the liquefied material may be disposed in the third line L3 and may be provided towards the evaporation arrangement by opening the third operable flow restriction device 108. The flow rate of material may be controlled by controlling the force provided by the first actuator to the first unit or the first volume, i.e. by the speed of the first actuator. While providing the material via the first unit to the evaporation arrangement, the second operable flow restriction device 107 may be opened and liquefied material may be provided from the tank 102 to the second unit or the second volume. When the first volume is almost fully reduced or compressed, less force may be provided by the first actuator to the first unit or the first volume, i.e. the speed of the first actuator may be decelerated and the fourth operable flow restriction device 109 may be opened. The second actuator may then provide a force to the second unit, i.e. to the second volume such that the second volume is altered, i.e. reduced or compressed. Thus, the liquefied material may be disposed in the fourth line L4 and may be provided towards the evaporation arrangement. The third operable flow restriction device 108 may be closed. The first operable flow restriction device 106 may be opened and the first unit or the first volume may be provided with material from the tank 102 while the material is provided by the second unit to the evaporation arrangement.

According to embodiments that can be combined with any other embodiment described herein, the procedure as described above may be repeated, i.e. when the second unit or the second volume is almost fully reduced or compressed, less force may be provided by the second actuator to the second unit or the second volume, i.e. the speed of the second actuator may be decelerated and the third operable flow restriction device 108 may be opened. The first actuator may then provide a force to the first unit or the first volume and the procedure can be repeated as described above. Refilling of the tank 102, i.e. the provision of raw material to the tank may occur when no material may be provided from the tank to the first unit and/or the second unit.

It is to be understood that both the first unit and the second unit, i.e. the first volume and the second volume may be provided with material from the tank prior to providing the material from one of the first and the second unit towards the evaporation arrangement.

According to embodiments that can be combined with any other embodiment described herein, the first operable flow restriction device 106, the second operable flow restriction device 107, the third operable flow restriction device 108 and the fourth operable flow restriction device 109 may be valves, in particular a ball valve or a freeze valve. The operable flow restriction devices may be controlled by a controller for opening and/or closing the respective operable flow restriction device.

According to embodiments that can be combined with any other embodiment described herein, providing a force to the first unit i.e. to the first volume or to the second unit, i.e. to the second volume may occur simultaneously with providing less force by the second actuator to the second unit or the second volume or may occur simultaneously with providing less force by the first actuator to the first unit or the first volume, respectively. Accordingly, when the second unit or the second volume is almost out of material or the first unit or the first volume is almost out of material, respectively, the liquefied material may instantly be provided by the first unit or the first volume, or the second unit or the second volume, respectively, such that material provision may not be interrupted or may be continuous.

According to embodiments that can be combined with any other embodiment described herein, the first unit may include a first compressible device and the second unit may include a second compressible device. The first compressible device and the second compressible device may include the first volume 116 and the second volume 118, respectively. In particular the first compressible device and the second compressible device may be a membrane bellow.

According to embodiments that can be combined with any other embodiment described herein, the first unit may include a first pushing device and the second unit may include a second pushing device, in particular a compressor and/or a forcer for reducing or compressing the first volume and the second volume of the first unit and the second unit, respectively. The pushing device may be configured for pushing the material from the first volume and/or the second volume towards the evaporation arrangement. The first actuator and the second actuator may be connected to the first and second pushing device for controlling a speed or force of the first pushing device and the second pushing device, respectively.

According to embodiments that can be combined with any other embodiment described herein, the first actuator and/or the second actuator may apply a reverse force to the first unit, i.e. to the first volume and/or the second unit, i.e. the second volume, respectively. By providing a reverse force, the first volume and/or the second volume may be expanded. Thus, (re)filling of the first unit and/or the second unit or the first volume and/or the second volume may be enabled. Further, by applying a reverse force to the first unit and/or the second unit, i.e. the first volume and/or the second volume, provision of material from the first unit and/or the second unit towards the evaporation arrangement may be stopped. Capillary forces in the plurality of lines, in particular in conduit L, may move the liquefied material inside the conduit backwards, i.e. in the direction of the dosage system, such that the provision of material may be stopped instantaneously.

Figure 3:
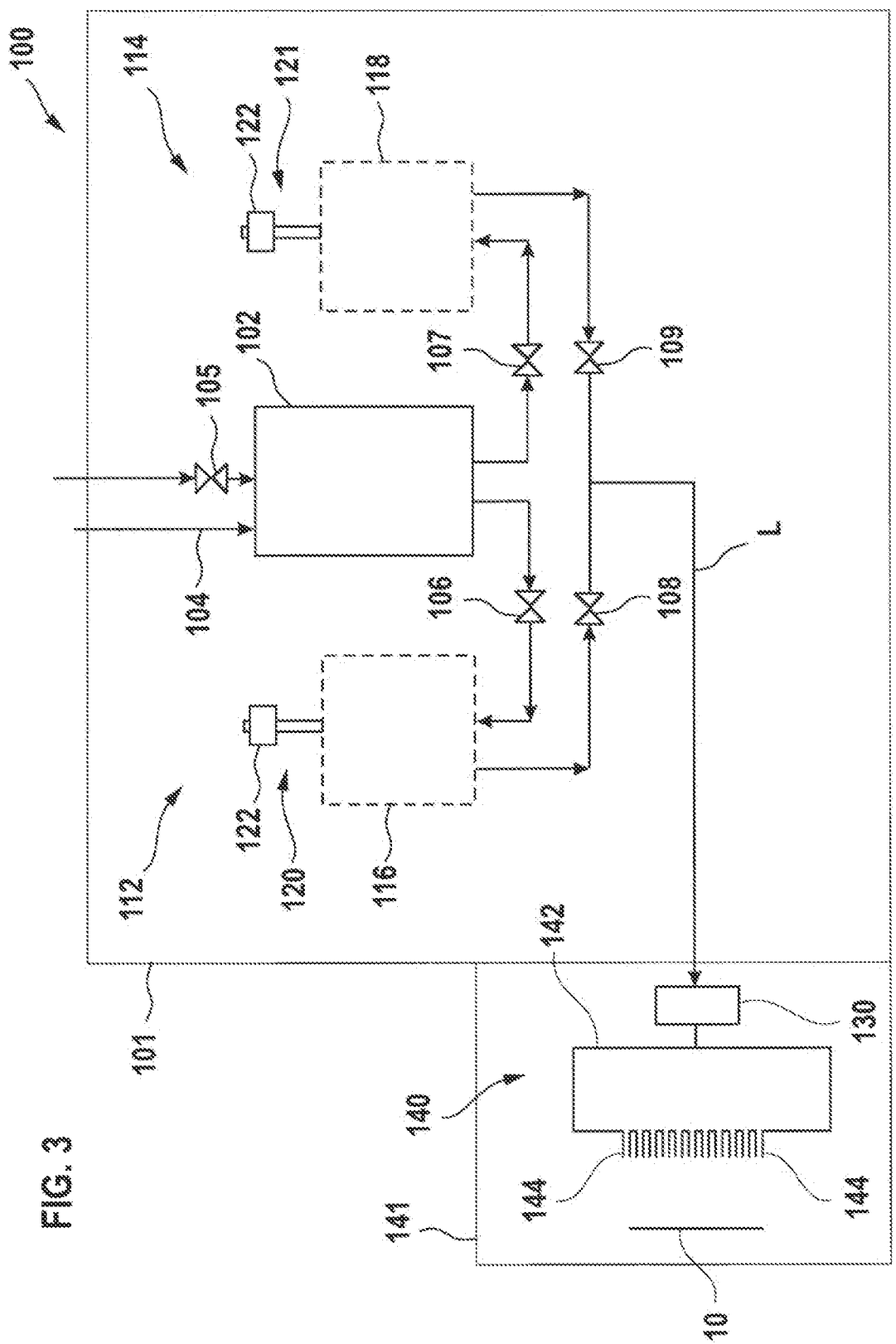
FIG. 3 shows a vapor deposition apparatus according to embodiments described herein.

According to some embodiments, which can be combined with other embodiments described herein and as exemplarily shown in FIG. 3, a vapor deposition apparatus is provided. The vapor deposition apparatus 100 may include a dosage system and an evaporation arrangement. The dosage system may be provided in a first compartment 101. The dosage system may be a dosage system as described with respect to FIG. 2. For example, the vapor deposition apparatus may include a tank 102 for providing a liquefied material, a first unit 112 having an alterable first volume 116 and a second unit 114 having an alterable second volume 118. The tank may be provided with the material to be liquefied via a filling inlet. Provision of the material to be liquefied may be regulated by a flow restriction device 105. Further, the tank may include a gas inlet 104 for providing an overpressure in the tank. The tank may be in fluid communication with the first unit via a first line. The first line may include a first operable flow restriction device 106. Further, the tank may be in fluid communication with the second unit via a second line. The second line may include a second operable flow restriction device 107. The liquefied material may be provided to the first unit and/or the second unit by establishing the overpressure in the tank 102, thus pushing the liquid material into the first line and/or the second line. The first unit may include a first actuator 120 for altering the first volume 116. The first actuator 120 may include a motor 122. The second unit may include a second actuator 121 for altering the second volume 118. The second actuator 121 may include a motor 122. The first actuator 120 and/or the second actuator 121 may be configured to alter the first volume and/or the second volume, respectively. By altering the first volume and/or the second volume, the liquid material may be provided from the first unit and/or the second unit towards the evaporation arrangement 140. The vapor deposition apparatus may include a conduit L for providing the liquid material to the evaporation arrangement. The first unit may be in fluid communication with the conduit L via a third line. The third line may include a third operable flow restriction device 108. Further, the second unit may be in fluid communication with the conduit L via a fourth line. The fourth line may include a fourth operable flow restriction device 109.

According to embodiments that can be combined with any other embodiment described herein, the evaporation arrangement 140 may include a crucible 130 and an enclosure 142 in fluid communication with the crucible. The evaporation arrangement may be provided in a second compartment 141. The evaporation arrangement may be configured for flash evaporation. The enclosure, i.e. a distribution enclosure, can be a vapor distribution pipe or a vapor distribution showerhead. The vapor can exit the enclosure through the plurality of nozzles 142 provided in or at a wall of the enclosure. Particularly, a pressure within the enclosure is at least one magnitude higher as compared to the pressure in the second chamber, for example, a vacuum chamber, in which the evaporator is at least partially disposed.

According to embodiments that can be combined with any other embodiment described herein, the liquefied or liquid material may be provided from the dosage system, i.e. from the first unit and the second unit towards the evaporation arrangement. The liquid material may be provided to the crucible 130 for evaporation. The crucible may be heated to a temperature for evaporating the liquid material. The crucible can be heated with an electrical heater. For example, the crucible can be connected to a graphite heater. The "evaporation temperature" as used herein may be understood as a temperature inside the crucible upstream of the plurality of nozzles at which the source material evaporates. For example, the evaporation temperature inside the crucible may be set to a temperature above 600° C., such as 750° C. to 850° C., if lithium is evaporated.

According to embodiments that can be combined with any other embodiment described herein, the evaporated material may be guided from the crucible into a distribution enclosure, such as the enclosure 142. The evaporated material may be guided from the distribution enclosure through a plurality of nozzles 144 on or towards a substrate 10. For example, the substrate 10 can be a thin web or foil, particularly of a roll-to-roll vacuum deposition apparatus. The substrate may be coated with the evaporated material. It is to be understood that the evaporation arrangement may be any evaporation arrangement suitable for depositing a material onto a substrate, in particular to deposit a metal, more particularly an alkali earth metal, to the substrate. It is further to be understood that the evaporation arrangement may include further heating arrangements for heating the evaporation arrangement during deposition e.g. to avoid condensation of material at the enclosure. Furthermore, the dosage system may be combined with any evaporation system or material deposition system.

According to embodiments that can be combined with any other embodiment described herein, the material provided to the substrate, i.e. the material liquefied in and provided by the dosage system may be a metal, in particular lithium, metal alloys, and other vaporizable materials or the like. According to yet further embodiments, additionally or alternatively, the material may include magnesium (Mg), ytterbium (YB) and lithium fluoride (LiF). According to embodiments which can be combined with other embodiments described herein, the temperature of the evaporation arrangement, the crucible and/or of the nozzles can be at least 600° C., or particularly between 600 C.° and 1000 C.°, or more particularly between 600° C. and 800° C. According to embodiments which can be combined with other embodiments described herein, the temperature may be provided with a deviation of ±10° C. or less.

According to embodiments that can be combined with any other embodiment described herein, lithium may for example be deposited on a thin copper foil to generate an anode of a battery. Further, a layer including graphite and at least one of silicon and a silicon oxide may be provided on a thin web or foil. The web or foil may further include a conductive layer or may consist of a conductive layer serving as a contact surface of the anode. Lithium deposited on the layer on the web may provide prelithiation of the layer including graphite and at least one of silicon and a silicon oxide.

Advantageously, by providing the dosage system for providing the liquid or liquefied material to the evaporation arrangement, a continuous material provision for coating the substrate can be ensured and improved. Material provision, i.e. the flow of material provided to the evaporation arrangement, can be more precisely regulated such that a continuous evaporation of the material in the evaporation arrangement can be established. Furthermore, the resulting evaporation rate may indirectly be regulated in a precise way. Further advantageously, the evaporation process can immediately be stopped by immediately stopping provision of the liquid material via the dosage system, e.g. for maintenance of the second compartment e.g. a processing chamber. Accordingly, by mechanical compression, evaporation speed can be accurately regulated.

Further advantageously, by providing the liquid material, e.g. lithium, in the dosage system, reaction of the material at the evaporation arrangement with other molecules, e.g. oxygen, particularly when the material enters the evaporation arrangement, can be avoided or prevented. Thus, venting the vapor deposition apparatus, in particular venting of the second compartment, e.g. the processing chamber, can be facilitated and provided without the risk of negative side effects.

Figure 4:
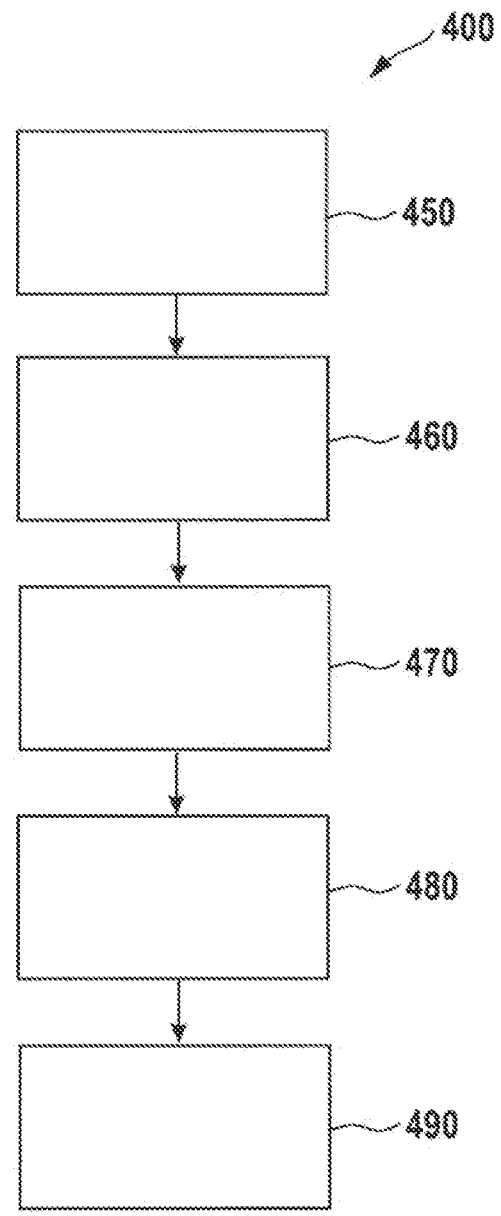
FIG. 4 shows a flow diagram of a method according to embodiments described herein.

According to embodiments that can be combined with any other embodiment described herein and as exemplarily shown in FIG. 4, a method 400 for dosing a liquefied material is provided. The method includes liquefying (indicated by box 450 in FIG. 4) a material in a tank. The material may be heated in the tank to or above a melting temperature to provide a liquefied material.

According to embodiments that can be combined with any other embodiment described herein, the method further includes providing (indicated by box 460 in FIG. 4) the liquefied material from the tank to a first unit having an alterable first volume and to a second unit having an alterable second volume. The material may be provided through a plurality of lines. In particular, the material may be provided via a first line to the first unit and via a second line to the second unit. The material may be provided to the first alterable volume and the second alterable volume, respectively. The material may be provided simultaneously to the first unit and the second unit or sequentially. For providing the material to the first unit and the second unit, an overpressure in the tank may be generated by disposing an inert gas in the tank. For example, argon may be provided in the tank via a gas inlet. The overpressure may be controlled to control the amount of material provided from the tank to the first unit and the second unit. According to embodiments, the tank may be continuously refilled with material to be liquefied.

According to embodiments that can be combined with any other embodiment described herein, the method further includes acting (indicated by box 470 in FIG. 4) on the alterable first volume with a first actuator providing a first force to transport the liquefied material from the first unit towards an evaporation arrangement. The first force may be modified to control a flow rate of the material from the first unit to the evaporation arrangement. For example, the first force may be high to provide more material to the evaporation arrangement and may be lowered for providing less material to the evaporation arrangement.

According to embodiments that can be combined with any other embodiment described herein, the method further includes acting (indicated by box 480 in FIG. 4) on the alterable second volume with a second actuator providing a third force to transport the liquefied material from the second unit towards the evaporation arrangement. The third force may be modified to control a flow rate of the material from the first unit to the evaporation arrangement. The method further includes acting on the alterable first volume with the first actuator providing a second force lower than the first force. For example, when providing the third force to the alterable second volume, the second force, being lower than the first force, may be provided to the alterable first volume. Accordingly, when starting providing the material to the evaporation arrangement from the second unit, material flow from the first unit towards the evaporation arrangement may be lowered, i.e. less material may be provided from the first unit towards the evaporation arrangement and subsequently stopped.

According to embodiments that can be combined with any other embodiment described herein, the method further includes acting (indicated by box 490 in FIG. 4) on the alterable second volume with the second actuator providing a fourth force lower than the third force. Further, when providing the fourth force to the alterable second volume, the first force may be applied to the alterable first volume, the first force being higher than the fourth force. Accordingly, when less material is provided by the second unit, the material may be provided from the first unit to the evaporation arrangement. The material flow from the second unit towards the evaporation arrangement may be lowered, i.e. less material may be provided from the second unit towards the evaporation arrangement and subsequently stopped.

According to embodiments that can be combined with any other embodiment described herein, the first force and the second force may be regulated by regulating the first actuator. For example, the first force and the second force may be increased by increasing a speed of the first actuator. Further, the first force and the second force may be decreased by decreasing the speed of the first actuator. Similarly, the third force and the fourth force may be regulated by regulating the second actuator. For example, the third force and the fourth force may be increased by increasing a speed of the second actuator. Further, the third force and the fourth force may be decreased by decreasing the speed of the second actuator.

Accordingly, material flow towards the evaporation arrangement may be precisely regulated by controlling the first actuator and the second actuator, respectively.

According to embodiments that can be combined with any other embodiment described herein, the method may further include acting on the liquefied material in the tank with a gas, particularly an inert gas. Accordingly, the first unit and the second unit, i.e. the alterable first volume and the alterable second volume may be refilled with material liquefied in the tank. When material is provided by the second unit towards the evaporation arrangement, the first unit, i.e. the alterable first volume may be refilled, i.e. the overpressure in the tank may be provided and material may be guided towards the first unit. Guiding of the material may include opening of a first operable flow restriction device, e.g. a valve, to allow for the liquefied material to be guided and to be disposed in the first unit, i.e. in the alterable first volume. Similarly, when material is provided by the first unit towards the evaporation arrangement, the second unit, i.e. the alterable second volume may be refilled. The overpressure in the tank may be provided and material may be guided towards the second unit. Guiding of the material may include opening of a second operable flow restriction device, e.g. a valve, to allow for the liquefied material to be guided and to be disposed in the second unit, i.e. in the second volume.

According to embodiments that can be combined with any other embodiment described herein, the method may further include acting with a first negative force on the alterable first volume to transport liquefied material from the tank to the first unit. Thus, the first alterable volume may be expanded and liquefied material may be provided to the first unit, i.e. to the expanded alterable first volume. The first operable flow restriction device may be open. Further, the method may include acting with a second negative force on the alterable second volume to transport liquefied material from the tank to the second unit. Thus, the second alterable volume may be expanded and liquefied material may be provided to the second unit, i.e. to the expanded alterable second volume. The second operable flow restriction device may be open.

According to embodiments that can be combined with any other embodiment described herein, the method may further include stopping transporting the liquefied material from the first unit or the second unit towards the evaporation arrangement when acting with the negative force on the alterable first volume and/or the alterable second volume. In other words, the method may include acting with a first negative force on the alterable first volume for stopping transportation of material from the first unit towards the evaporation arrangement. The material flow provided from the first unit towards the evaporation arrangement may be stopped. Further, the method may include acting with the second negative force on the alterable second volume for stopping transportation of material from the second unit towards the evaporation arrangement. The material flow provided by the second unit may be stopped. Accordingly, material provision from the first unit and/or the second unit may be precisely regulated.

Various further embodiments are provided in the present disclosure, some of which are listed in the below listing of clauses.

Clause 1. A vapor deposition apparatus, comprising: a tank for providing a liquefied material; a first unit having an alterable first volume, the first unit comprising a first actuator and a first line to be in fluid communication with the tank; a second unit having an alterable second volume, the second unit comprising a second actuator and a second line to be in fluid communication with the tank; and an evaporation arrangement, the evaporation arrangement being in fluid communication with the first unit and the second unit; wherein the first actuator and the second actuator are configured to alternatingly provide a force to the alterable first volume and the alterable second volume for providing the liquefied material to the evaporation arrangement.

Clause 2. The vapor deposition apparatus according to clause 1, the vapor deposition apparatus further comprising a heating arrangement to provide heat to the material to obtain the liquefied material.

Clause 3. The vapor deposition apparatus according to any of clauses 1 or 2, wherein the first line comprises a first operable flow restriction device to regulate a first flow of the liquefied material towards the first unit; and wherein the second line comprises a second operable flow restriction device to regulate a second flow of the liquefied material towards the second unit.

Clause 4. The vapor deposition apparatus according to any of clauses 1 to 3, wherein the tank comprises a gas inlet to provide a gas to the tank to provide the liquefied material to the first unit and the second unit.

Clause 5. The vapor deposition apparatus according to any of clauses 1 to 4, wherein the tank comprises a filling inlet to provide the material to the tank.

Clause 6. The vapor deposition apparatus according to any of clauses 1 to 5, wherein the first unit comprises a first compressible device and the second unit comprises a second compressible device, in particular the first compressible device and the second compressible device being a membrane bellow.

Clause 7. The vapor deposition apparatus according to any of clauses 1 to 5, wherein the first unit comprises a first pushing device and the second unit comprises a second pushing device, in particular a compressor and/or a forcer.

Clause 8. The vapor deposition apparatus according to any of the preceding clauses, wherein the first unit and the second unit are made of a material that is resistant to corrosion.

Clause 9. The vapor deposition apparatus according to any of clauses 3 to 8, wherein the first operable flow restriction device and the second operable flow restriction device may be a valve, in particular a ball valve or a freeze valve.

Clause 10. The vapor deposition apparatus according to any of clauses 1 to 9, wherein the material is a metal selected from the group consisting of an alkali metal or an alkaline earth metal.

Clause 11. A dosage system to provide a liquefied material to an evaporation arrangement, the dosage system comprising: a first unit having an alterable first volume and comprising a first actuator; a second unit having an alterable second volume and comprising a second actuator; wherein the first actuator and the second actuator are configured to alternatingly provide a force to the first unit and the second unit to alternatingly alter the first volume and the second volume to provide the liquefied material to the evaporation arrangement.

Clause 12. The dosage system according to clause 11, wherein the first actuator and the second actuator are a linear motor, particularly a motor driven spindle gear, a crank shaft and/or a rack-and-pinion drive.

Clause 13. A method for dosing a liquefied material, the method comprising: liquefying a material in a tank; providing the liquefied material from the tank to a first unit having an alterable first volume and to a second unit having an alterable second volume; acting on the alterable first volume with a first actuator providing a first force to transport the liquefied material from the first unit towards an evaporation arrangement; acting on the alterable second volume with a second actuator providing a third force to transport the liquefied material from the second unit towards the evaporation arrangement and acting on the alterable first volume with the first actuator providing a second force lower than the first force; and acting on the alterable second volume with the second actuator providing a fourth force lower than the third force.

Clause 14. The method according to clause 13, the method further comprising: acting with a first negative force on the alterable first volume for stopping transportation of material from the first unit towards the evaporation arrangement.

Clause 15. The method according to any of clauses 13 to 14, the method further comprising: acting with a second negative force on the alterable second volume for stopping transportation of material from the second unit towards the evaporation arrangement.

Clause 16. The method according to clauses 13 to 15, wherein providing the liquefied material to the first unit and the second unit comprises acting on the liquefied material in the tank with a gas, particularly an inert gas.

Clause 17. The method according to any of clauses 13 to 16, wherein the tank is continuously refilled with material to be liquefied.

While the foregoing is directed to embodiments of the disclosure, other and further embodiments of the disclosure may be devised without departing from the basic scope thereof, and the scope thereof is determined by the claims that follow.

The invention claimed is:

1. A vapor deposition apparatus, comprising:
a tank for providing a liquefied material;
a first unit having an alterable first volume, the first unit comprising a first actuator and a first line to be in fluid communication with the tank;
a second unit having an alterable second volume, the second unit comprising a second actuator and a second line to be in fluid communication with the tank; and
an evaporation arrangement, the evaporation arrangement being in fluid communication with the first unit and the second unit;
wherein the first actuator and the second actuator are configured to alternatingly provide a force to the alterable first volume and the alterable second volume so that the liquefied material is alternatingly provided from the first unit to the evaporation arrangement and from the second unit to the evaporation arrangement.

2. The vapor deposition apparatus according to claim 1, the vapor deposition apparatus further comprising a heating arrangement to provide heat to a material to obtain the liquefied material.

3. The vapor deposition apparatus according to claim 1, wherein the first line comprises a first operable flow restriction device to regulate a first flow of the liquefied material towards the first unit; and wherein the second line comprises a second operable flow restriction device to regulate a second flow of the liquefied material towards the second unit.

4. The vapor deposition apparatus according to claim 3, wherein the first operable flow restriction device and the second operable flow restriction device comprise a valve.

5. The vapor deposition apparatus according to claim 1, wherein the tank comprises a gas inlet to provide a gas to the tank to provide the liquefied material to the first unit and the second unit.

6. The vapor deposition apparatus according to claim 1, wherein the tank comprises a filling inlet to provide a material to the tank.

7. The vapor deposition apparatus according to claim 1, wherein the first unit comprises a first compressible device and the second unit comprises a second compressible device.

8. The vapor deposition apparatus according to claim 7, wherein the first compressible device is a first membrane bellow and the second compressible device is a second membrane bellow.

9. The vapor deposition apparatus according to claim 1, wherein the first unit comprises a first pushing device and the second unit comprises a second pushing device.

10. The vapor deposition apparatus according to claim 1, wherein the first unit and the second unit are made of a material that is resistant to corrosion.

11. The vapor deposition apparatus according to claim 1, wherein the liquefied material is a metal selected from the group consisting of an alkali metal or an alkaline earth metal.

12. A dosage system to provide a liquefied material to an evaporation arrangement, the dosage system comprising:
a first unit having an alterable first volume and comprising a first actuator,
a second unit having an alterable second volume and comprising a second actuator,
wherein the first actuator and the second actuator are configured to alternatingly provide a force to the first unit and the second unit to alternatingly alter the first volume and the second volume so that the liquefied material is alternatingly provided from the first unit to the evaporation arrangement and from the second unit to the evaporation arrangement.

13. The dosage system to provide a liquefied material to an evaporation arrangement according to claim 12, wherein the first actuator and the second actuator are linear motors.

14. The dosage system to provide a liquefied material to an evaporation arrangement according to claim 13, wherein the first actuator and the second actuator are selected from the group of a motor driven spindle gear, a crank shaft and a rack-and-pinion drive.

15. A method for dosing a liquefied material, the method comprising:
liquefying a material in a tank;
providing the liquefied material from the tank to a first unit having an alterable first volume and to a second unit having an alterable second volume;
acting on the alterable first volume with a first actuator providing a first force to transport the liquefied material from the first unit towards an evaporation arrangement;
acting on the alterable second volume with a second actuator providing a third force to transport the liquefied material from the second unit towards the evaporation arrangement and acting on the alterable first volume with the first actuator providing a second force lower than the first force; and
acting on the alterable second volume with the second actuator providing a fourth force lower than the third force.

16. The method for dosing a liquefied material according to claim 15, the method further comprising:
acting with a first negative force on the alterable first volume for stopping transportation of the liquefied material from the first unit towards the evaporation arrangement.

17. The method for dosing a liquefied material according to claim 15, the method further comprising:
   acting with a second negative force on the alterable second volume for stopping transportation of the liquefied material from the second unit towards the evaporation arrangement.

18. The method for dosing a liquefied material according to claim 15, wherein providing the liquefied material to the first unit and the second unit comprises acting on the liquefied material in the tank with a gas.

19. The method for dosing a liquefied material according to claim 18, wherein the gas is an inert gas.

20. The method for dosing a liquefied material according to claim 15, wherein the tank is continuously refilled with the material to be liquefied.

\* \* \* \* \*